(12) United States Patent
Jenkins (10) Patent No.: US 9,100,739 B2
(45) Date of Patent: *Aug. 4, 2015

(54) HIGH OUTPUT LOUDSPEAKER

(71) Applicant: VOXX INTERNATIONAL CORPORATION, Hauppauge, NY (US)

(72) Inventor: Todd K. Jenkins, Sanford, FL (US)

(73) Assignee: VOXX INTERNATIONAL CORPORATION, Hauppauge, NY (US)

( * ) Notice: Subject to any disclaimer, the term of this patent is extended or adjusted under 35 U.S.C. 154(b) by 294 days.

This patent is subject to a terminal disclaimer.

(21) Appl. No.: 13/731,679

(22) Filed: Dec. 31, 2012

(65) Prior Publication Data

US 2013/0136287 A1 May 30, 2013

Related U.S. Application Data

(60) Continuation of application No. 12/939,404, filed on Nov. 4, 2010, now Pat. No. 8,345,908, which is a division of application No. 11/620,395, filed on Jan. 5, 2007, now Pat. No. 7,831,057.

(51) Int. Cl.
*H04R 25/00* (2006.01)
*H04R 1/02* (2006.01)
*H04R 1/28* (2006.01)

(52) U.S. Cl.
CPC .............. *H04R 1/025* (2013.01); *H04R 1/2826* (2013.01); *H04R 1/2834* (2013.01)

(58) Field of Classification Search
CPC .......... H04R 1/28; H04R 1/2807; H04R 1/30; H04R 1/2861; H04R 1/2815–1/2826; H04R 1/00; H04R 2205/022; H04R 2201/401; H04R 2201/405

USPC .................. 381/337–341, 349, 352–354, 182
See application file for complete search history.

(56) References Cited

U.S. PATENT DOCUMENTS

| | | | | |
|---|---|---|---|---|
| 4,215,761 A * | 8/1980 | Andrews | ...................... | 181/152 |
| 4,301,332 A * | 11/1981 | Dusanek | ...................... | 381/349 |
| 4,733,749 A * | 3/1988 | Newman et al. | ............... | 181/144 |
| 5,253,301 A * | 10/1993 | Sakamoto et al. | ............... | 381/89 |
| 5,388,162 A * | 2/1995 | Sohn | .............................. | 381/160 |
| 5,850,460 A * | 12/1998 | Tanaka et al. | ................. | 381/186 |
| 5,898,138 A * | 4/1999 | Delgado, Jr. | .................. | 181/152 |
| 6,704,426 B2 * | 3/2004 | Croft, III | ........................ | 381/351 |
| 6,782,112 B1 * | 8/2004 | Geddes | ......................... | 381/351 |
| 7,039,212 B2 * | 5/2006 | Poling et al. | .................. | 381/349 |
| 7,046,816 B2 * | 5/2006 | Vandersteen | ................. | 381/182 |
| 7,133,533 B2 * | 11/2006 | Chick et al. | ................... | 381/349 |
| 2003/0228027 A1 * | 12/2003 | Czerwinski | .................... | 381/342 |

* cited by examiner

Primary Examiner — Suhan Ni
(74) Attorney, Agent, or Firm — F. Chau & Associates, LLC (57) ABSTRACT

A loudspeaker system includes a speaker enclosure having an opening in a front wall, and a speaker manifold mounted within the speaker enclosure and communicating with the opening. The speaker manifold includes a pair of substantially parallel side walls, a back wall, and top and bottom walls, defining a manifold chamber. The wall opposite the back wall is substantially open to define a manifold opening and to permit the communicating. The manifold opening is substantially in alignment with the front wall opening. A woofer is mounted on a first wall of the speaker manifold. An acoustic vent is mounted on a second wall of the manifold, such that the woofer and the acoustic vent face each other at one of about a 180 degree angle or about a 90 degree angle.

15 Claims, 9 Drawing Sheets

HIGH OUTPUT LOUDSPEAKER

CROSS-REFERENCE TO RELATED APPLICATIONS

This application is a continuation of co-pending U.S. application Ser. No. 12/939,404, filed on Nov. 4, 2010, which is a divisional of U.S. application Ser. No. 11/620,395 filed on Jan. 5, 2007, which issued as U.S. Pat. No. 7,831,057 on Nov. 9, 2010, the disclosures of which are each hereby incorporated by reference herein in their entireties.

BACKGROUND OF THE INVENTION

1. Technical Field

The present disclosure relates to a low-frequency sound reproduction system for high power output, and more particularly to a low-frequency sound reproduction system having a manifold, a low frequency speaker, and one or more passive radiators and/or air ports.

2. Discussion of the Related Art

A woofer is a loudspeaker driver that is designed to produce low-frequency sounds, typically from around 40 Hertz up to about a few thousand hertz. Nearly all woofers are driven by a voice coil in a magnetic field, connected to an amplifier. The voice coil assembly is an electric motor. When current flows through the voice coil wire, the coil moves according to Fleming's left hand rule, causing the coil to push or pull like a piston. The voice coil is typically cemented to the back of the speaker cone, which creates sound waves as it is pushed back and forth.

A sub-woofer is similar to a woofer, but is dedicated to the reproduction of bass frequencies, typically from about 20 Hz to about 200 Hz. Since it is difficult for small loudspeakers to reproduce frequencies below 80 Hz, especially above 100 dB, a loudspeaker intended specifically for this task is often used. There is a growing demand for compact, high-output subwoofer systems for use in both home and professional settings.

Many existing designs use horn loading to provide high efficiency and low distortion, but these systems are typically very large. Shorter horn-loaded systems such as those described in U.S. Pat. No. 5,898,138 detail a method of including multiple drivers, ports or passive radiators into a single horn throat. However, the very short nature of the horn severely restricts the efficiency gain and air load effectiveness at low frequencies. To obtain better efficiency and still keep a small enclosure size, some designs use a low frequency horn that is folded. U.S. Pat. No. 4,215,761 relates to a bass sound projection system which uses a folded horn. While this approach reduces the overall size of the system, it is still very large compared to a conventional sealed or ported enclosure.

An alternate solution to standard horn loading is called "manifolding" and was proposed in U.S. Pat. No. 4,733,749. This design increases efficiency and reduces distortion while allowing the use of relatively large loudspeakers in a very compact cabinet. This configuration optionally uses a sealed or ported cabinet, and the manifold may form the throat of a horn for even higher performance at the cost of increased size.

Other designs employ multiple chambers in various styles of bandpass enclosures. These systems can vary in size significantly, but the smaller designs are usually designed to have high mid-bass efficiency (50-150 Hz) and sacrifice low frequency extension. Most commercial applications also have a severely degraded transient response as a natural result of high-order upper and lower frequency rolloffs.

Alternate designs use passive radiators (drones) in place of ports as a method to decrease system size and reduce air noise inevitable from a standard port. A passive radiator ideally should be capable of very high excursion and of substantially greater surface area than the active woofer. A known commercial design with such features uses large woofers and multiple large passive radiators, both of which significantly increase the size of the speaker system. Another design uses very compact enclosures with multiple passive radiators, but these are very low in efficiency and require very powerful amplifiers to produce meaningful sound pressure level (SPL).

There exists a need to provide a new loudspeaker system to provide high output, low distortion, low noise, and extended frequency response.

SUMMARY OF THE INVENTION

According to an exemplary embodiment of the present invention there is provided a loudspeaker system which includes a speaker enclosure having an opening in a front wall, and a speaker manifold mounted within said enclosure and communicating with the opening. The speaker manifold includes a pair of substantially parallel side walls, a back wall, and top and bottom walls, defining a manifold chamber. The wall opposite the back wall is substantially open to define a manifold opening and to permit the communicating. The manifold opening is substantially in alignment with the front wall opening. A woofer is mounted on a first wall of the speaker manifold. An acoustic vent is mounted on a second wall of the manifold, such that the woofer and the acoustic vent face each other at about a 180 degree angle or about a 90 angle.

According to an exemplary embodiment of the present invention there is provided a loudspeaker system which includes a speaker enclosure having a first opening in a first speaker enclosure wall and a second opening in a second speaker enclosure wall. A first speaker manifold is mounted within the enclosure and communicates with the first speaker enclosure wall opening. The first speaker manifold includes a pair of substantially parallel first side walls, a first back wall, and first top and bottom walls, defining a first manifold chamber. The wall opposite the first back wall is substantially open to define a first manifold opening and to permit the communicating. The first manifold opening is substantially in alignment with the first speaker enclosure wall opening. A second speaker manifold is mounted within the enclosure and communicates with the second speaker enclosure wall opening. The second speaker manifold includes a pair of substantially parallel second side walls, a second back wall, and second top and bottom walls, defining a second manifold chamber. The wall opposite the second back wall is substantially open to define a second manifold opening and to permit the communicating. The second manifold opening is substantially in alignment with the second speaker enclosure wall opening. An acoustic vent is mounted on a first wall of the first speaker manifold and disposed at about a 180 degree or about a 90 degree angle relative to a second wall of the first speaker manifold. A woofer is mounted on a first wall of the second speaker manifold and disposed at about a 180 degree angle or about a 90 degree angle relative to a second wall of the second speaker manifold.

According to an exemplary embodiment of the present invention there is provided a loudspeaker system which includes a speaker enclosure having an opening in a front wall, a speaker manifold mounted within the enclosure and communicating with the opening. The manifold includes a pair of substantially parallel side walls, a back wall, and top and bottom walls, defining a manifold chamber. The wall opposite the back wall is substantially open to define a manifold opening and to permit the communicating. The manifold opening is substantially in alignment with the front wall opening. A first acoustic vent is mounted on a first wall of the speaker manifold. A second acoustic vent is mounted on a second wall of the speaker manifold, such that the first acoustic vent faces the second acoustic at about a 180 degree angle. A woofer is mounted on a third wall of the speaker manifold and faces the front wall opening. The woofer is disposed at about a 90 degree angle relative to the first and second acoustic vents.

According to an exemplary embodiment of the present invention there is provided a loudspeaker system which includes
a speaker enclosure having a first opening in a first speaker enclosure wall and a second opening in a second speaker enclosure wall. A first speaker manifold is mounted within the enclosure and communicates with the first speaker enclosure wall opening. The manifold includes a pair of substantially parallel first side walls, a first back wall, and first top and bottom walls, defining a first manifold chamber. The wall opposite the first back wall is substantially open to define a first manifold opening and to permit the communicating. The first manifold opening is substantially in alignment with the first speaker enclosure wall opening. A second speaker manifold is mounted within the enclosure and communicates with the second speaker enclosure wall opening. The second manifold includes a pair of substantially parallel second side walls, a second back wall, and second top and bottom walls, defining a second manifold chamber. The wall opposite the second back wall is substantially open to define a second manifold opening and to permit the communicating to the second speaker enclosure wall opening. The second manifold opening is substantially in alignment with the second speaker enclosure wall opening. A first acoustic vent is mounted on a first wall of the first speaker manifold. A second acoustic vent is mounted on a second wall of the first speaker manifold, such that the first acoustic vent faces the second acoustic vent at about a 180 degree angle or about a 90 degree angle. A woofer is mounted on a first wall of the second speaker manifold and faces a second wall of the second speaker manifold at about a 180 degree angle or about a 90 degree angle.

It is to be understood that an "acoustic vent" as used herein refers to a passive radiator, an air port, or other similar device. An acoustic vent takes over the output load of a woofer at low frequencies and provides much of the output. The acoustic vent and enclosure airspace combine at a certain frequency to resonate, and the woofer drives the resonance, At a range of frequencies around this resonance, the acoustic vent moves much more than the woofer.

BRIEF DESCRIPTION OF THE DRAWINGS

Exemplary embodiments of the invention can be understood in more detail from the following descriptions taken in conjunction with the accompanying drawings in which.

DETAILED DESCRIPTION OF THE EXEMPLARY EMBODIMENTS

Exemplary embodiments of the present invention will be described below in more detail with reference to the accompanying drawings. This invention may, however, be embodied in different forms and should not be construed as limited to the embodiments set forth herein. Rather, these embodiments are provided so that this disclosure will be thorough and complete, and will fully convey the scope of the invention to those skilled in the art.

Figure 1:
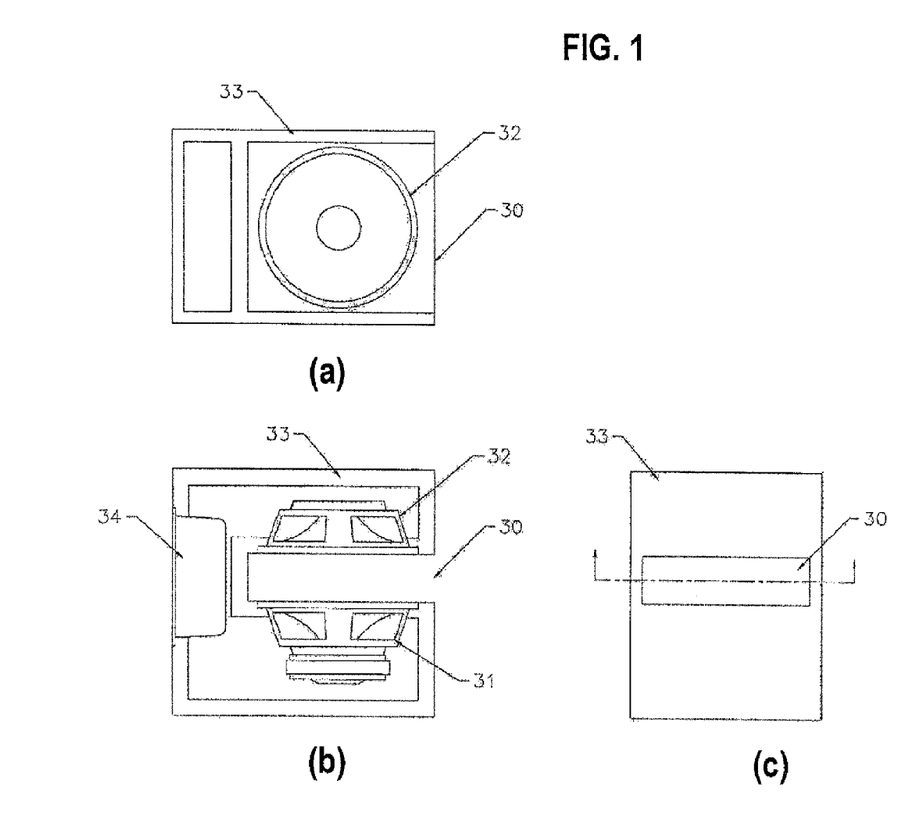
FIGS. 1(a)-(c) illustrate a top cross-section, side cross-section and front view of a loudspeaker system, respectively according to an exemplary embodiment of the present invention.

FIG. 1 illustrates different views of a loudspeaker system, according to an exemplary embodiment of the present invention. FIG. 1(a) illustrates a top cross-section of the present exemplary embodiment. FIG. 1(b) illustrates a side cross-section of the present exemplary embodiment. FIG. 1(c) illustrates a front view of the present exemplary embodiment.

Referring to FIG. 1, the loudspeaker system has a speaker enclosure 33 which includes a manifold 30, a woofer 31, a passive radiator 32, and a power amplifier 34. The enclosure 33 (also known as a cabinet) is hollow and may be made out of wood, metal or any other suitable material.

The manifold 30 is essentially a well in the enclosure 33 having a pair of substantially parallel side walls, a back wall, a top wall, and a bottom wall, forming a manifold chamber. The wall opposite the back wall is substantially open to define a manifold opening.

The woofer 31 is mounted on a first wall of the manifold. The passive radiator 32 is mounted on a second wall of the manifold 30, such that the woofer 31 and the passive radiator 32 face each other at about a 180 degree angle or about a 90 degree angle (not shown).

A surround of the woofer 31 may be adjacent to the first wall of the manifold 30 and a surround of the passive radiator 32 may be adjacent to the second wall of the manifold 30. The surround of the woofer may be partially covered by the speaker enclosure 33.

The woofer 31 and the passive radiator 32 may be separated from one another by a distance which may be determined through experimentation by varying the dimensions of the manifold. The dimensions of the manifold 30 may be optimized to improve low frequency efficiency and distortion characteristics, and may vary considerably depending on the woofer/passive radiator suspension characteristics and desired bandwidth of the system.

The woofer 31 is an active woofer and may be of a conventional high excursion design. The passive radiator 32 is optionally oval in shape to save in cabinet volume. The oval design allows for the highest overall surface area while keeping the total depth of the cabinet to a minimum. It also reduces the overall length of the manifold section, which helps to prevent any standing wave resonances that may otherwise exit. Embodiments of the present invention, however, are not limited to oval shaped passive radiators or woofers, as each may be shaped as a circle, a rectangle, a square, or any other suitable shape. The dimensions of the passive radiator 32 illustrated in FIG. 1 may be, for example, an oval of ten inches by eight inches. However, the dimensions of the woofer 31 and passive radiator 32 may vary considerably. Although FIG. 1 illustrates using a passive radiator 32 as an acoustic vent, the passive radiator 32 may be replaced with an air port of suitable length and diameter. The length and diameter of the air port may be determined through experimentation and adjusted as necessary.

The power amplifier 34 is optionally part of the enclosure 33 since the loudspeaker system may be adapted to use an external power amplifier. The power amplifier may be class A, class AB, class D, class H, or any other suitable type. The power amplifier may have active electronics processing for equalization, low-pass and high-pass crossovers and output limiters to prevent woofer damage or excessive distortion.

Figure 2:
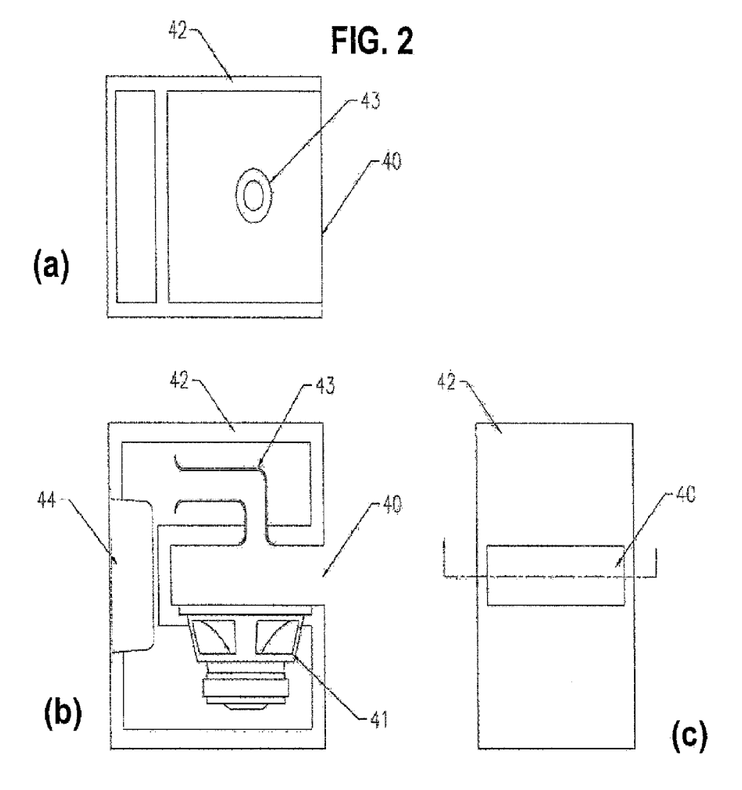
FIGS. 2(a)-(c) illustrate a top cross-section, side cross-section and front view of the loudspeaker system of FIG. 1, respectively where the passive radiator has been replaced with an air port, according to an exemplary embodiment of the present invention.

FIG. 2 illustrates a different configuration of the loudspeaker system of FIG. 1, where the passive radiator 32 has been replaced with an air port 43, according to an exemplary embodiment of the present invention. FIG. 2(a) illustrates a top cross-section of the present exemplary embodiment. FIG. 2(b) illustrates a side cross-section of the present exemplary embodiment. FIG. 2(c) illustrates a front view of the present exemplary embodiment.

Referring to FIG. 2, the loudspeaker system includes an enclosure 42 having an air port 43, a woofer 41, a manifold 40, and a power amplifier 44. While an opening of the air port 43 is illustrated as facing the woofer 41 at an angle of about 180 degrees, the woofer may also be adjusted to face the air port 43 at an angle of about 90 degrees (not shown). The air port 43, having a predetermined diameter extends into the enclosure 42 for a predetermined length. The length and diameter of the air port can be determined through experimentation.

Figure 3:
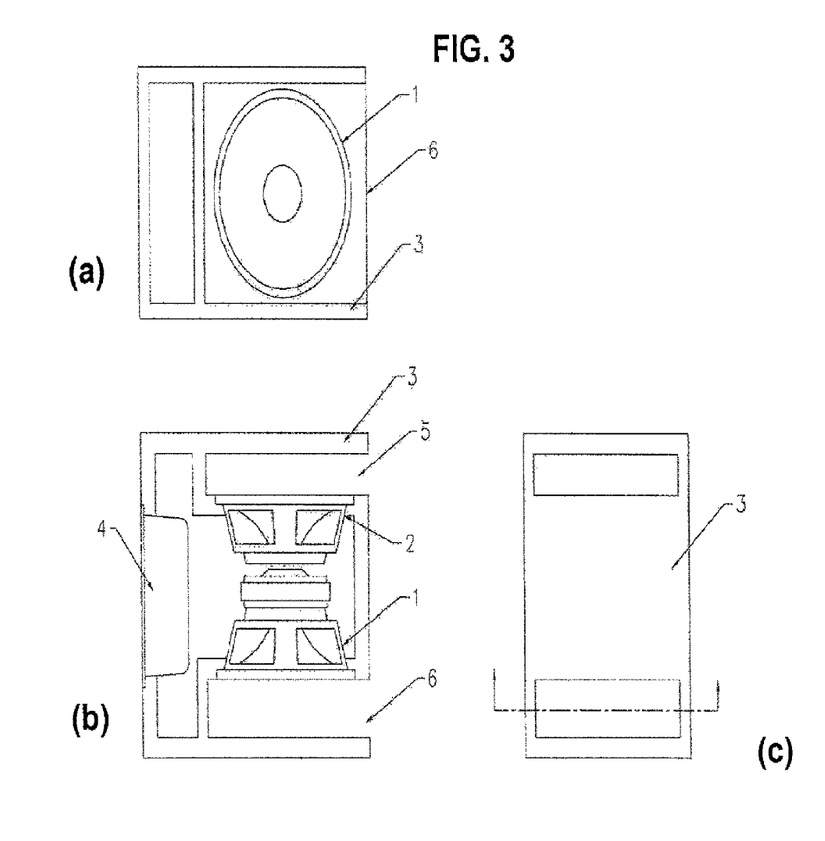
FIGS. 3(a)-(c) illustrate a side top section, side cross-section and front view of a loudspeaker system, respectively according to an exemplary embodiment of the present invention.

FIG. 3 illustrates different views of a loudspeaker system, according to an exemplary embodiment of the present invention. FIG. 3(a) illustrates a top cross-section of the present exemplary embodiment. FIG. 3(b) illustrates a side cross-section of the present exemplary embodiment. FIG. 3(c) illustrates a front view of the present exemplary embodiment.

Referring to FIG. 3, the loudspeaker system includes an enclosure 3 having a passive radiator manifold 5, a woofer manifold 6, a passive radiator 2, a woofer 1, and a power amplifier 4. The passive radiator manifold 5 and the woofer manifold 6 are similar to the manifolds illustrated in FIGS. 1-2. The structure of the components that make up this embodiment, such as the passive radiator 2, the woofer 1, and amplifier are similar to those discussed above in FIGS. 1-2.

The passive radiator 2 is mounted to a first side of the passive radiator manifold 5, such that it faces a second side of the passive radiator manifold 5 at about a 180 degree angle or about a 90 degree angle (not shown).

The woofer 1 is mounted to a first side of the woofer manifold 6, such that it faces a second side of the woofer manifold 6 at about a 180 degree angle or about a 90 degree angle (not shown).

A passive radiator manifold opening or exit of the passive radiator manifold 5 may be on the same side of the enclosure 3 as an exit of the woofer manifold 6 or may optionally exit on a different surface.

The passive radiator 2 may be a predetermined distance away from one side of the enclosure 3 based on the size of the passive radiator manifold 5. The woofer 1 may be a predetermined distance away from a side of the enclosure 3 based on the size of the woofer manifold 6. These distances can be determined through experimentation by varying the dimensions of the passive radiator manifold 5 and the woofer manifold 6 as discussed in connection with the manifold 30 illustrated in FIG. 1 above.

A surround of the passive radiator 2 may be adjacent to a side of the passive radiator manifold 5. A surround of the woofer may be adjacent to a side of the woofer manifold. The surround of the woofer may be partially covered by the enclosure 3.

As discussed above for FIG. 1, the power amplifier is optional and the passive radiator 2 may be replaced with an air port.

Figure 4:
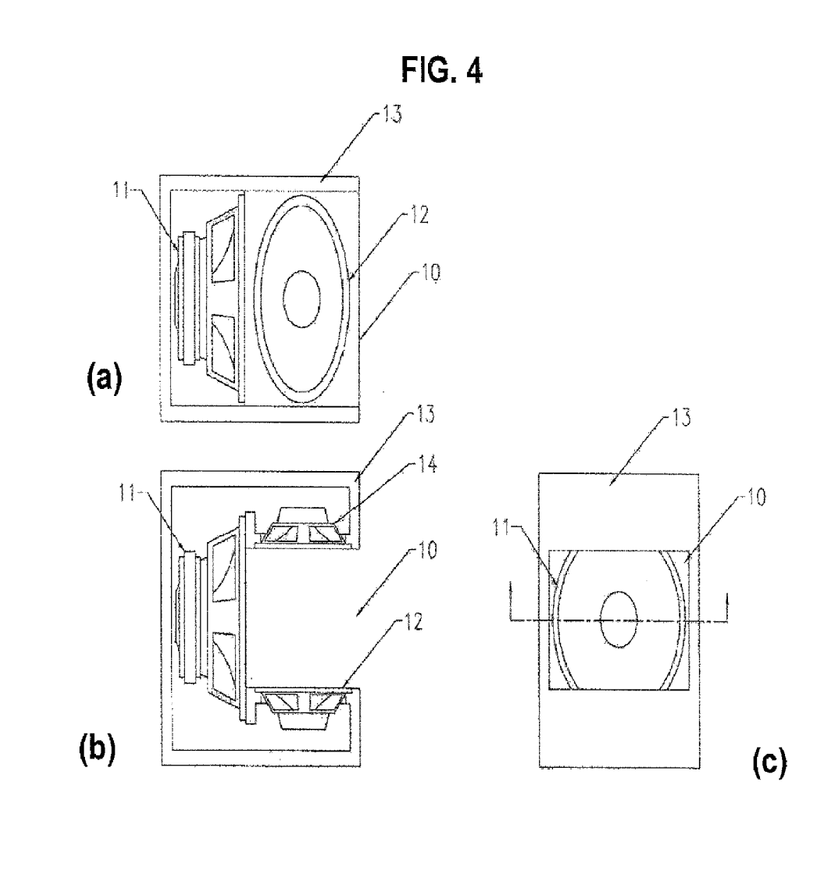
FIGS. 4(a)-(c) illustrate a top cross-section, side cross-section and front view of a loudspeaker system, respectively according to an exemplary embodiment of the present invention.

FIG. 4 illustrates a loudspeaker system, according to an exemplary embodiment of the present invention. FIG. 4(a) illustrates a top cross-section of the present exemplary embodiment. FIG. 4(b) illustrates a side cross-section of the present exemplary embodiment. FIG. 4(c) illustrates a front view of the present exemplary embodiment.

Referring to FIG. 4, the loudspeaker system includes an enclosure 13, having a woofer 11, a first passive radiator 12, a second passive radiator 14, and a manifold 10. The manifold 10 is similar to the manifolds illustrated in FIGS. 1-3. The structure of the components that make up this embodiment, such as the passive radiators 12 and 14, and the woofer 11 are similar to those discussed above in FIGS. 1-3.

The first passive radiator 12 faces towards the second passive radiator 14 at an angle of about 180 degrees. The distance between the first passive radiator 12 and the second passive radiator 14 depends on the dimensions of the manifold 10 and can be adjusted through experimentation. The woofer 11 is arranged at about a 90 degree angle with respect to the first passive radiator 12 and the second passive radiator 14.

A surround of the first passive radiator 12 may be adjacent to a first side of the manifold 10. A surround of the second passive radiator 14 may be adjacent to a second side of the manifold 10. A surround of the woofer 11 may be adjacent to a third side of the manifold. The woofer surround may be partially covered by the walls of the manifold without ill effect. In some instances, the entire surround and a portion of the cone may be shaded by the enclosure construction, in a similar manner to compression phase plugs in high-frequency horn transducers. This serves to improve the coupling efficiency in addition to the gains from manifolding.

As in the previous embodiments, the power amplifier is optional and the passive radiators 12 and 14 may be replaced with an air port.

Figure 5:
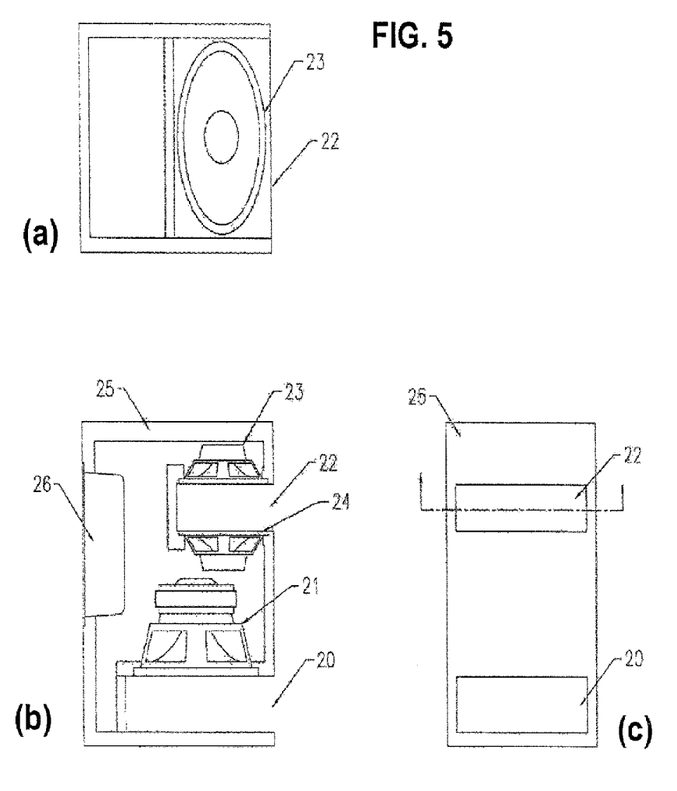
FIGS. 5(a)-(c) illustrate a top cross-section, side cross-section and front view of a loudspeaker system, respectively according to an exemplary embodiment of the present invention.

FIG. 5 illustrates a loudspeaker system, according to an exemplary embodiment of the present invention. FIG. 5(a) illustrates a top cross-section of the present exemplary embodiment. FIG. 5(b) illustrates a side cross-section of the present exemplary embodiment. FIG. 5(c) illustrates a front view of the present exemplary embodiment.

Referring to FIG. 5, the loudspeaker system has an enclosure 25 which has a first passive radiator 23, a second passive radiator 24, passive radiator manifold 22, a woofer 21, a woofer manifold 20, and a power amplifier 26. The passive radiator manifold 22 and the woofer manifold 20 are similar to the manifolds illustrated in the previous figures. The structure of the components that make up this embodiment, such as the passive radiators 23 and 24, the woofer 21, and the amplifier 26 are similar to those discussed in the previous figures.

The first passive radiator 23 faces towards the second passive radiator 24 at an angle of about 180 degrees or about 90 degrees (not shown). The first passive radiator 23 and the second passive radiator 24 are mounted respectively to a first and second wall of the passive radiator manifold 22. A surround of the first passive radiator 23 may be adjacent to a first side of the passive radiator manifold. A surround of the second passive radiator 24 may be adjacent to a second side of the passive radiator manifold. A surround of the woofer 21 may be adjacent to a side of the woofer manifold 20. The surround of the woofer 21 may be partially covered by the enclosure 25.

As in the previous figures, the power amplifier 26 is optional and each of the passive radiators 23 and 24 may be replaced with an air port.

It should be noted that while all of the previously discussed embodiments have been illustrated with one or two manifolds, the present invention is not limited to any particular number of manifolds. As an example, a third manifold could be added to the loudspeaker system illustrated in FIG. 5. Additionally, passive radiators, air ports, and woofers, could be mounted to sides of the third manifold.

In operation, the interaction of an enclosure having a woofer, a passive radiator, and a manifold vary based on frequency. At upper frequencies, substantially above the resonant frequency of a enclosure/passive radiator combination, the woofer cone is loaded in a small chamber, which provides an improvement in the actual air displacement, and provides actual acoustic output. The cone can get a smaller volume of air moving easier than making the air in an entire living room. This shows up as an acoustic resistance that acts against the cone's excursion. Design of the passive radiators is very important at these upper frequencies because if the passive radiators move much, they will absorb some of the acoustic output of the active woofer. This is because the improved efficiency of coupling the woofer to the manifold's air also means that the air is efficiently coupled to the front of the passive radiators. At frequencies just above to just below the enclosure resonance, the internal resonance of the enclosure is very effective at controlling the cone motion. At frequencies below the resonance, the manifold provides an acoustic resistance that is not seen in conventional enclosures. The acoustic resistance of the manifold tends to limit the maximum motion of the cones, which keeps distortion down and helps the mechanical reliability of the components.

Figure 6:
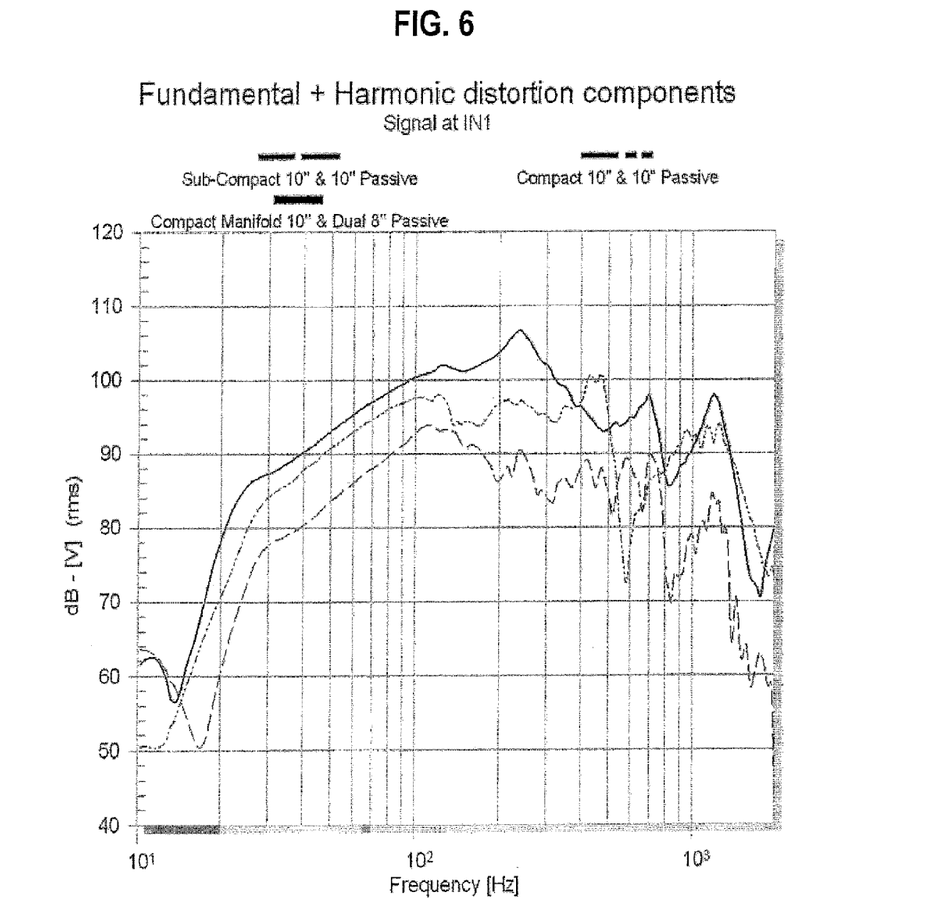
FIG. 6 is a graph illustrating the output efficiency of the loudspeaker system illustrated in FIG. 4 as compared to conventional loudspeaker systems.
Figure 8:
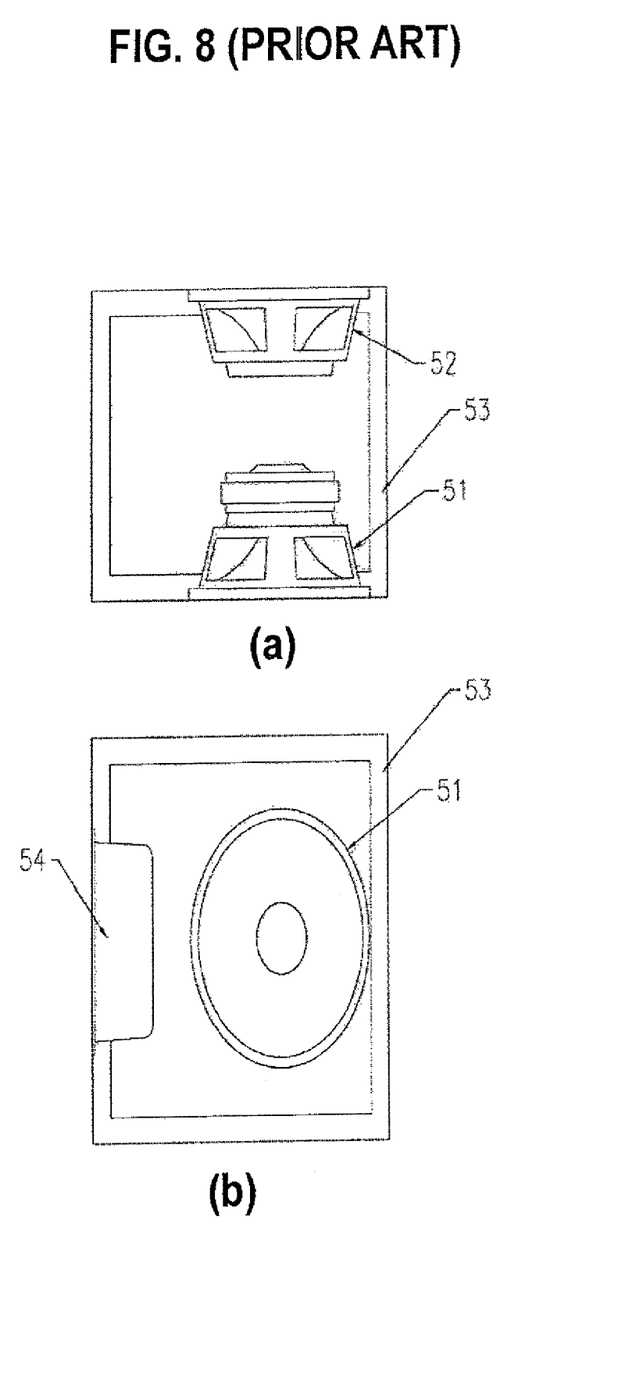
FIGS. 8(a)-(b) illustrate a top cross-section and side cross-section, respectively, of a conventional loudspeaker system having a compact design.
Figure 9:
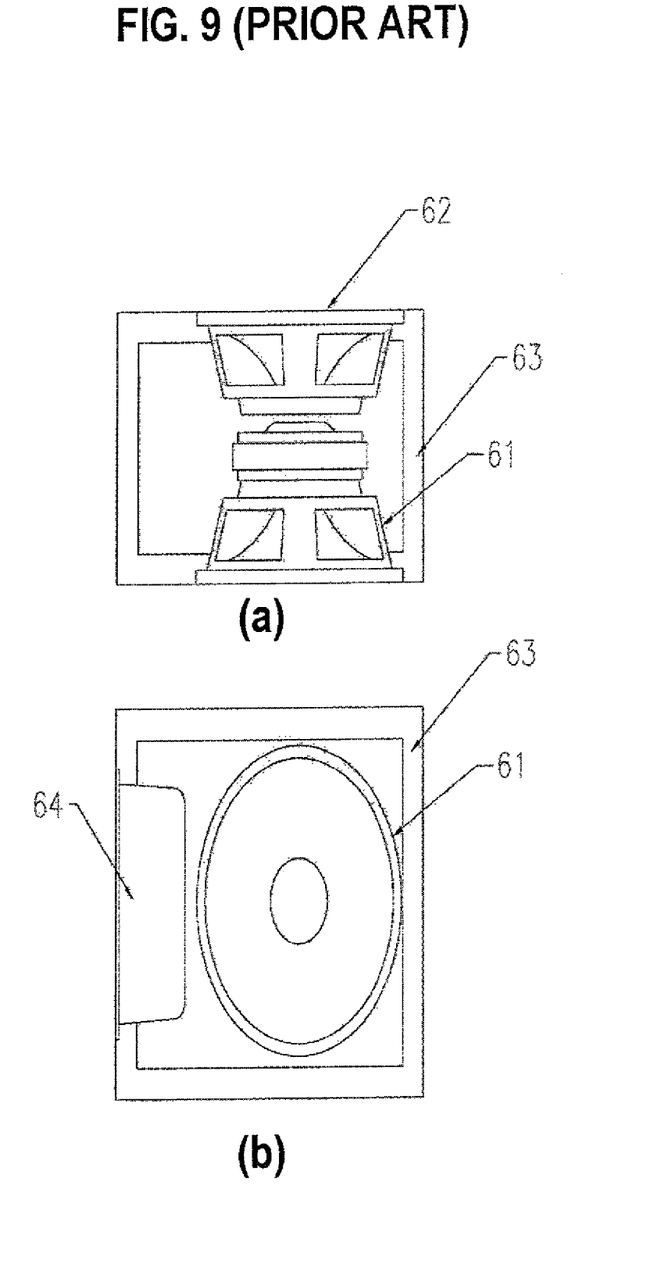
FIGS. 9(a)-(b) illustrate a top cross-section and side cross-section, respectively, of a conventional loudspeaker system having a sub-compact design.

FIG. 6 is a graph illustrating the output efficiency of an embodiment of the loudspeaker system illustrated in FIG. 4 as compared to a conventional compact loudspeaker system illustrated in FIGS. 8(a)-(b), and a conventional sub-compact loudspeaker system illustrated in FIGS. 9(a)-(b). FIG. 8(a) and FIG. 8(b) illustrate a top cross-section and side cross-section, respectively, of a conventional compact loudspeaker system. The compact loud speaker system includes a passive radiator 52, a woofer 51, an enclosure 53, and a power amplifier 53. FIG. 9(a) and FIG. 9(b) illustrate a top cross-section and side cross-section, respectively, of a conventional sub-compact loudspeaker system. The sub-compact loudspeaker system includes a passive radiator 62, a woofer 61, an enclosure 63, and a power amplifier 64.

Referring to FIGS. 6, 8(a)-(b), and 9(a)-(b), the output efficiency of a conventional loudspeaker system having a compact design with a round ten inch diameter passive radiator 52 is illustrated by a dotted curve, the output efficiency of a conventional loudspeaker system having a sub-compact design with a round ten inch diameter passive radiator 62 is illustrated by a dashed curve, and the output efficiency of an embodiment of the loudspeaker system illustrated in FIG. 4 having two oval ten inch by eight inch passive radiators is illustrated by the solid curve. As shown in FIG. 6, the embodiment of the present invention illustrated outperforms the conventional designs by several dB, particularly over the 20 to 100 Hz frequency range.

Figure 7:
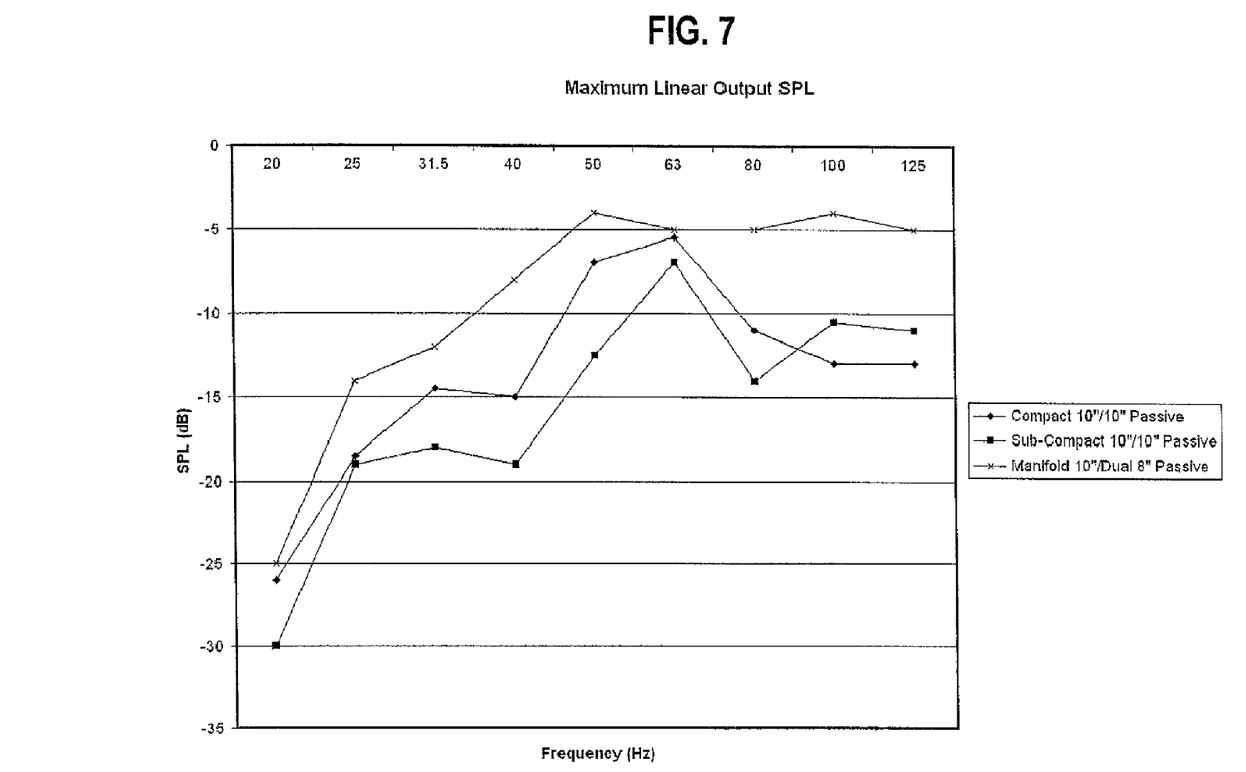
FIG. 7 is a relative graph of the maximum linear output sound pressure level of the loudspeaker system referenced in FIG. 6 as compared to conventional loudspeaker systems.

FIG. 7 is a relative graph of the maximum linear output sound pressure level of the embodiment of the loudspeaker system referenced in FIG. 6 as compared to the conventional loudspeaker systems of FIGS. 8(a)-(b), and FIGS. 9(a)-(b).

Referring to FIG. 7, the curve of the conventional compact loudspeaker system having a round ten inch diameter passive radiator 52 is marked with diamonds, the curve of the conventional subcompact loudspeaker system having a round ten inch diameter passive radiator 62 is marked with squares, and the manifolded dual oval ten inch by eight inch passive radiator embodiment is marked with Xs. The manifolded design generally outperforms the conventional designs between the pictured 20 and 125 Hz range. Between 25 and 50 Hz, the manifolded design outperforms the conventional designs by at least 2-3 dB and at some frequencies by as much as 4-6 dB.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A loudspeaker system, comprising:
a speaker enclosure having an opening in a front wall;
a speaker manifold mounted within said enclosure and communicating with said opening, said manifold comprising a pair of substantially parallel side walls, a back wall, and top and bottom walls, defining a manifold chamber, the wall opposite said back wall being substantially open, to define a manifold opening and to permit said communicating, said manifold opening being substantially in alignment with said front wall opening;
a first passive radiator mounted on a first wall of the speaker manifold;
a second passive radiator mounted on a second wall of the speaker manifold, such that the first acoustic vent faces the second acoustic at about a 180 degree angle; and
a woofer mounted on a third wall of the speaker manifold and facing the front wall opening,
wherein the woofer is disposed at about a 90 degree angle relative to the first and second acoustic vents.

2. The loudspeaker system as recited in claim 1, wherein a surround of the first passive radiator is adjacent to the first wall of the speaker manifold, a surround of the second passive radiator is adjacent to the second wall of the speaker manifold, and a surround of the woofer is adjacent to the third wall of the speaker manifold.

3. The loudspeaker system as recited in claim 1, wherein a surround of the woofer is partially covered by the speaker enclosure.

4. The loudspeaker system as recited in claim 1, wherein the speaker enclosure further includes a power amplifier.

5. The loudspeaker system as recited in claim 1, wherein a surface of at least one of the passive radiators is oval shaped.

6. The loudspeaker system as recited in claim 1, wherein the speaker enclosure is hollow.

7. A loudspeaker system, comprising:
a speaker enclosure having an opening in a front wall;
a speaker manifold mounted within said enclosure and communicating with said opening, said manifold comprising a pair of substantially parallel side walls, a back wall, and top and bottom walls, defining a manifold chamber, the wall opposite said back wall being substantially open, to define a manifold opening and to permit said communicating, said manifold opening being substantially in alignment with said front wall opening;
a first air port mounted on a first wall of the speaker manifold;
a second air port mounted on a second wall of the speaker manifold, such that the first air port faces the second air port at about a 180 degree angle; and
a woofer mounted on a third wall of the speaker manifold and facing the front wall opening,
wherein the woofer is disposed at about a 90 degree angle relative to the first and second air ports.

8. The loudspeaker system as recited in claim 7, wherein a surround of the woofer is partially covered by the speaker enclosure.

9. The loudspeaker system as recited in claim 7, wherein the speaker enclosure further includes a power amplifier.

10. The loudspeaker system as recited in claim 7, wherein the speaker enclosure is hollow.

11. A loudspeaker system, comprising:
a speaker enclosure having an opening in a front wall;
a speaker manifold mounted within said enclosure and communicating with said opening, said manifold comprising a pair of substantially parallel side walls, a back wall, and top and bottom walls, defining a manifold chamber, the wall opposite said back wall being substantially open, to define a manifold opening and to permit said communicating, said manifold opening being substantially in alignment with said front wall opening;
a passive radiator mounted on a first wall of the speaker manifold;
an air port mounted on a second wall of the speaker manifold, such that the passive radiator faces the air port at about a 180 degree angle; and
a woofer mounted on a third wall of the speaker manifold and facing the front wall opening,
wherein the woofer is disposed at about a 90 degree angle relative to the passive radiator and the air port.

12. The loudspeaker system as recited in claim 11, wherein a surround of the woofer is partially covered by the speaker enclosure.

13. The loudspeaker system as recited in claim 11, wherein the speaker enclosure further includes a power amplifier.

14. The loudspeaker system as recited in claim 11, wherein a surface of the passive radiator is oval shaped.

15. The loudspeaker system as recited in claim 11, wherein the speaker enclosure is hollow.

\* \* \* \* \*